United States Patent
Boralkar et al.

(10) Patent No.: US 11,608,890 B2
(45) Date of Patent: Mar. 21, 2023

(54) ELECTRO-MECHANICAL PARK LOCK ACTUATOR

(71) Applicant: Schaeffler Technologies AG & Co. KG, Herzogenaurach (DE)

(72) Inventors: Angad Boralkar, Akron, OH (US); Todd Sturgin, Wooster, OH (US); Chris Luipold, Wadsworth, OH (US)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 1004 days.

(21) Appl. No.: 16/373,684

(22) Filed: Apr. 3, 2019

(65) Prior Publication Data

US 2019/0338853 A1 Nov. 7, 2019

Related U.S. Application Data

(60) Provisional application No. 62/664,976, filed on May 1, 2018.

(51) Int. Cl.
*H02K 7/116* (2006.01)
*H02K 11/21* (2016.01)
(Continued)

(52) U.S. Cl.
CPC .......... *F16H 63/3416* (2013.01); *B60T 1/005* (2013.01); *H02K 7/116* (2013.01);
(Continued)

(58) Field of Classification Search
CPC ................ H02K 11/21; F16H 63/34
(Continued)

(56) References Cited

U.S. PATENT DOCUMENTS 6,824,390 B2 * 11/2004 Brown ................. H05K 1/0293
439/516
7,493,999 B2 2/2009 Reed et al.
(Continued)

FOREIGN PATENT DOCUMENTS

DE 19700935 A1 * 8/1997 ............. F16D 28/00
DE 10112427 A1 * 9/2002 ............. F02D 11/10
(Continued)

OTHER PUBLICATIONS

ISO26262, 'Road vehicles—Functional Safety, Part 9: Automotive Safety Integrity Level(ASIL)-oriented and safety-oriented analyses', 24 pages, International Standard, First edition, Nov. 11, 2011.
J2716 Standard, 'SENT—Single Edge Nibble Transmission for Automotive Applications', Surface Vehicle Information Report, 120 pages, SAE International, Apr. 2016.
(Continued)

*Primary Examiner* — Jose A Gonzalez Quinones

(57) ABSTRACT

An electro-mechanical park lock actuator includes a shaft and a circuit board. The shaft is arranged for connecting to a transmission park pawl. The circuit board includes a first non-contact inductive position sensor integrated circuit, a first trace electrically connected to the first non-contact inductive position sensor integrated circuit for determining an angular position of the shaft, and an electrical connector for connecting the circuit board to an external master controller. In some example embodiments, the electro-mechanical park lock actuator includes an electric motor drivingly connected to the shaft, and a transmission arranged in a torque path between the electric motor and the shaft.

18 Claims, 5 Drawing Sheets

(51) Int. Cl.
    *F16H 63/34*     (2006.01)
    *B60T 1/00*     (2006.01)
    *H05K 1/18*     (2006.01)

(52) U.S. Cl.
    CPC ............. *H02K 11/21* (2016.01); *H05K 1/181* (2013.01); *H05K 2201/09218* (2013.01); *H05K 2201/10151* (2013.01); *H05K 2201/10189* (2013.01)

(58) Field of Classification Search
    USPC .................. 310/68 B, 156.05; 129/219.5
    See application file for complete search history.

(56) References Cited

U.S. PATENT DOCUMENTS

| | | | |
|---|---|---|---|
| 9,789,562 B1* | 10/2017 | Granger ................. | B23K 11/36 |
| 2009/0091313 A1* | 4/2009 | Teeters ................... | G01B 7/003 |
| | | | 324/207.16 |

FOREIGN PATENT DOCUMENTS

| | | | | |
|---|---|---|---|---|
| DE | 102004015037 A1 * | 10/2005 | ........... | F02D 41/009 |
| DE | 102010028990 A1 * | 12/2011 | ........... | H01R 12/737 |

OTHER PUBLICATIONS

ZMID5203, 'Inductive Position Sensor IC', IDT Datasheet, 33 pages, Integrated Device Technology, Inc., Oct. 5, 2018 https://www.idt.com/products/sensor-products/position-sensors/zmid5203-inductive-position-sensor-ic.

* cited by examiner

ELECTRO-MECHANICAL PARK LOCK ACTUATOR

TECHNICAL FIELD

The present disclosure relates generally to a park lock actuator, and more specifically to an electro-mechanical park lock actuator.

BACKGROUND

Electro-mechanical transmission park actuators are known. U.S. Pat. No. 7,493,999 shows a hybrid electro-mechanical transmission park system.

SUMMARY

According to one embodiment, an electro-mechanical park lock actuator may include a shaft and a circuit board. The shaft is arranged for connecting to a transmission park pawl. The circuit board includes a first non-contact inductive position sensor integrated circuit, a first trace electrically connected to the first non-contact inductive position sensor integrated circuit for determining an angular position of the shaft, and an electrical connector for connecting the circuit board to an external master controller. In some example embodiments, the electro-mechanical park lock actuator includes an electric motor drivingly connected to the shaft, and a transmission arranged in a torque path between the electric motor and the shaft.

In some example embodiments, the transmission includes a cycloid reduction or a spur gear reduction. In an example embodiment, the cycloid reduction is 40:1 and the spur gear reduction is 2:1. In an example embodiment, the shaft includes a first axis and the electric motor includes a second axis, parallel to and offset from the first axis.

In some example embodiments, the electrical connector includes a first pin arranged for connection to an electric motor power supply, a second pin arranged for connection to a first power supply for the first non-contact inductive position sensor integrated circuit, and a third pin arranged to connect a first output of the first non-contact inductive position sensor integrated circuit to the external master controller. In an example embodiment, the first output uses a Single Edge Nibble Transmission protocol. In an example embodiment, the first trace includes at least one arc, the at least one arc includes a first center, and the shaft includes a first axis aligned with the first center.

In an example embodiment, the first non-contact inductive sensor integrated circuit is a 12 bit sensor capable of determining an angular position of the shaft with a resolution of 0.015 degrees. In some example embodiments, the circuit board includes a second non-contact inductive position sensor integrated circuit, and a second trace electrically connected to the second non-contact inductive position sensor integrated circuit for determining the angular position of the shaft. In some example embodiments, the first trace includes a first arc with a first center, and the second trace comprises second arc with a second center, aligned with the first center. In an example embodiment, the first arc and the second arc are arranged around the first center and 180 degrees apart. In an example embodiment, the circuit board includes a plurality of first traces and a plurality of first arcs, and a plurality of second traces and a plurality of second arcs.

In an example embodiment, the electrical connector includes a first pin arranged for connection to an electric motor power supply, a second pin arranged for connection to a power supply for the first non-contact inductive position sensor integrated circuit, a third pin arranged to connect a first output of the first non-contact inductive position sensor integrated circuit to the external master controller, a fourth pin arranged for connection to a power supply for the second non-contact inductive position sensor integrated circuit, and a fifth pin arranged to connect a second output of the second non-contact inductive position sensor integrated circuit to the external master controller. In an example embodiment the electro-mechanical park lock actuator is capable of an Automotive Safety Integrity Level D rating when the master controller is properly programmed. In an example embodiment, the electrical connector includes exactly six pins.

In some example embodiments, the shaft includes an end with a target. In an example embodiment, a portion of the end is machined so that the target protrudes from the portion. In an example embodiment, the target includes a pair of sectors arranged 180 degrees apart.

DETAILED DESCRIPTION

Embodiments of the present disclosure are described herein. It should be appreciated that like drawing numbers appearing in different drawing views identify identical, or functionally similar, structural elements. Also, it is to be understood that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The terminology used herein is for the purpose of describing particular aspects only, and is not intended to limit the scope of the present disclosure. Unless defined otherwise, all technical and scientific terms used herein have the same meaning as commonly understood to one of ordinary skill in the art to which this disclosure belongs. Although any methods, devices or materials similar or equivalent to those described herein can be used in the practice or testing of the disclosure, the following example methods, devices, and materials are now described.

Figure 1:
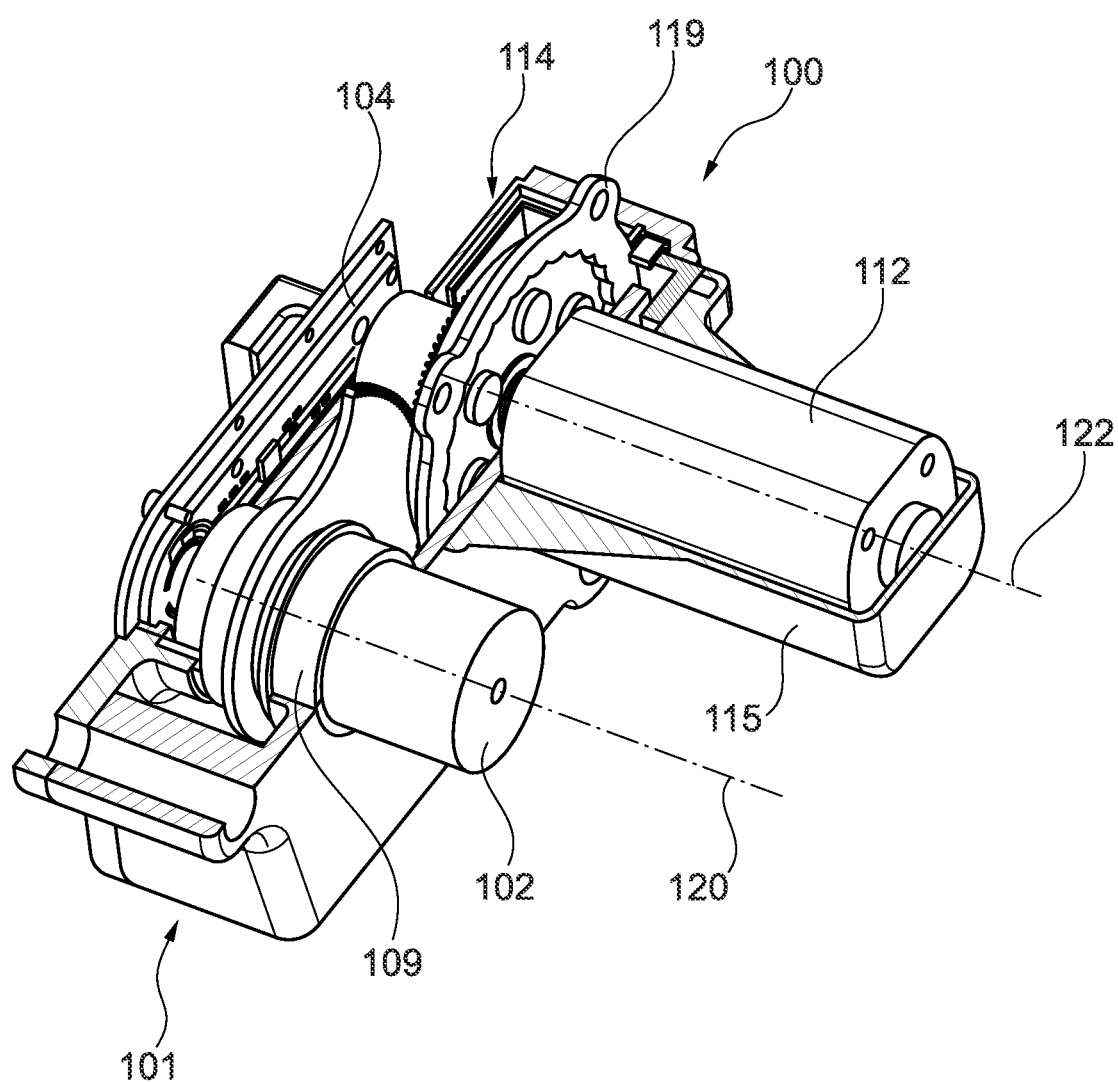
FIG. 1 illustrates a front perspective view of an electro-mechanical park lock actuator with a portion of a housing removed.
Figure 2:
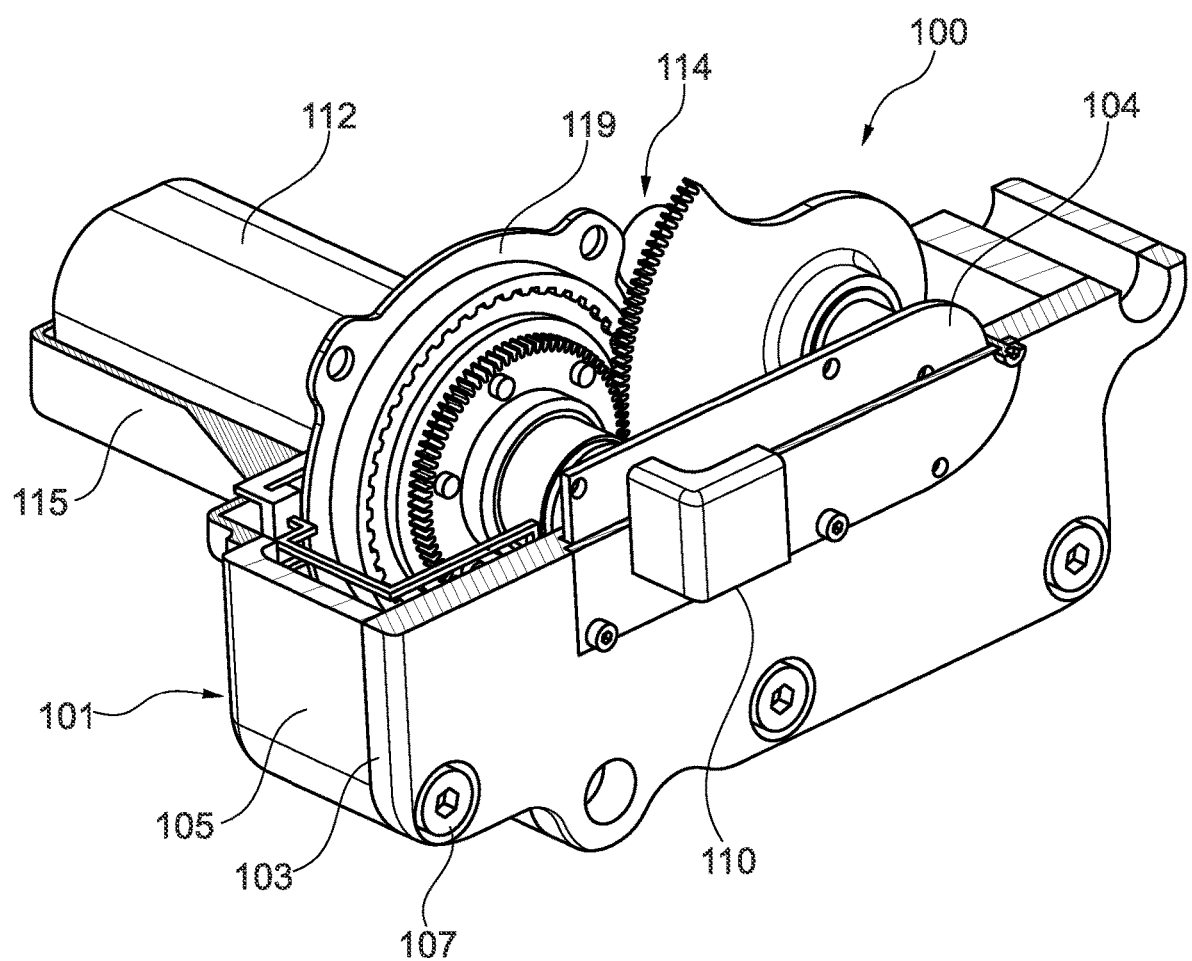
FIG. 2 illustrates a back perspective view of the electro-mechanical park lock actuator of FIG. 1 with the portion of the housing removed.
Figure 3:
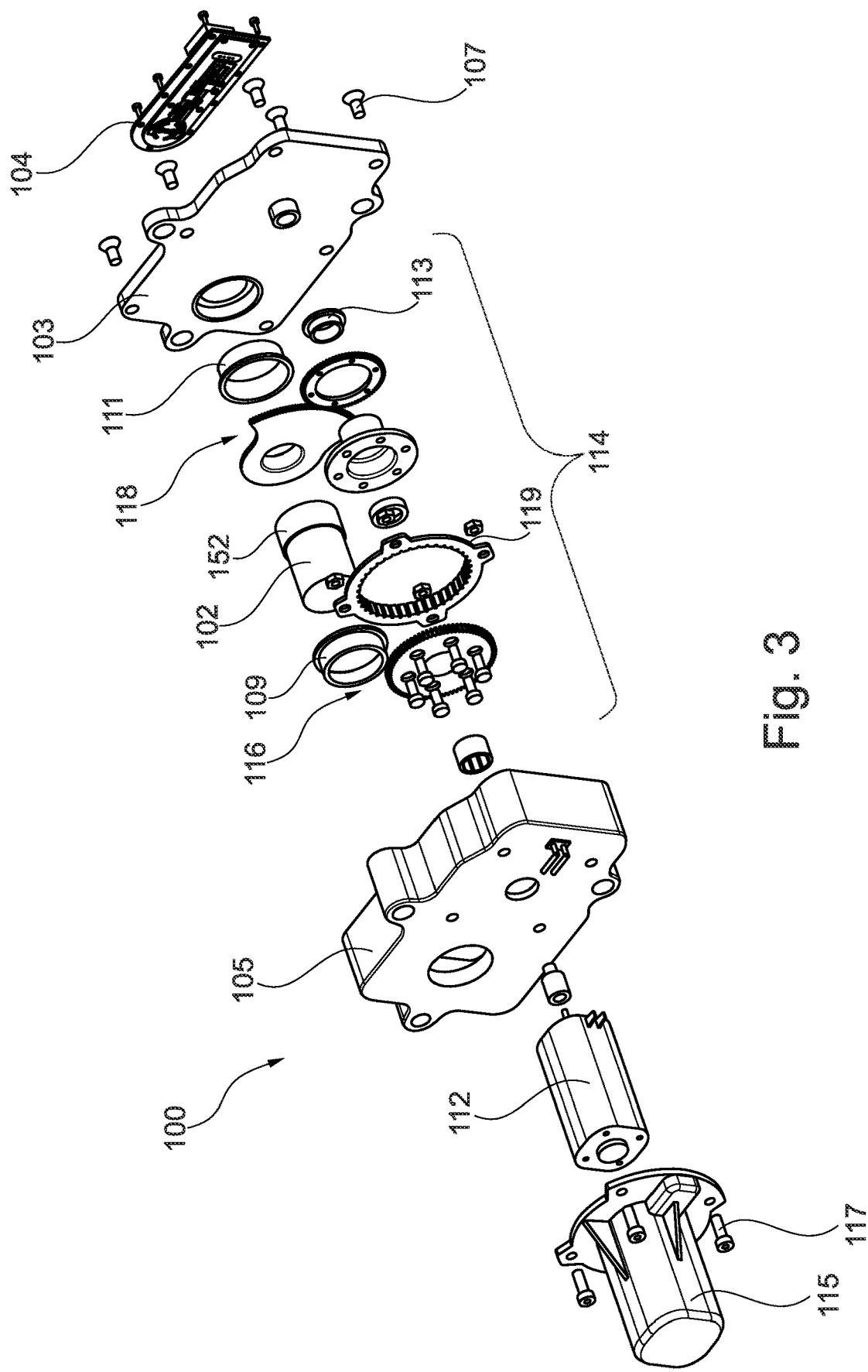
FIG. 3 illustrates a perspective exploded view of the electro-mechanical park lock actuator of FIG. 1.
Figure 4:
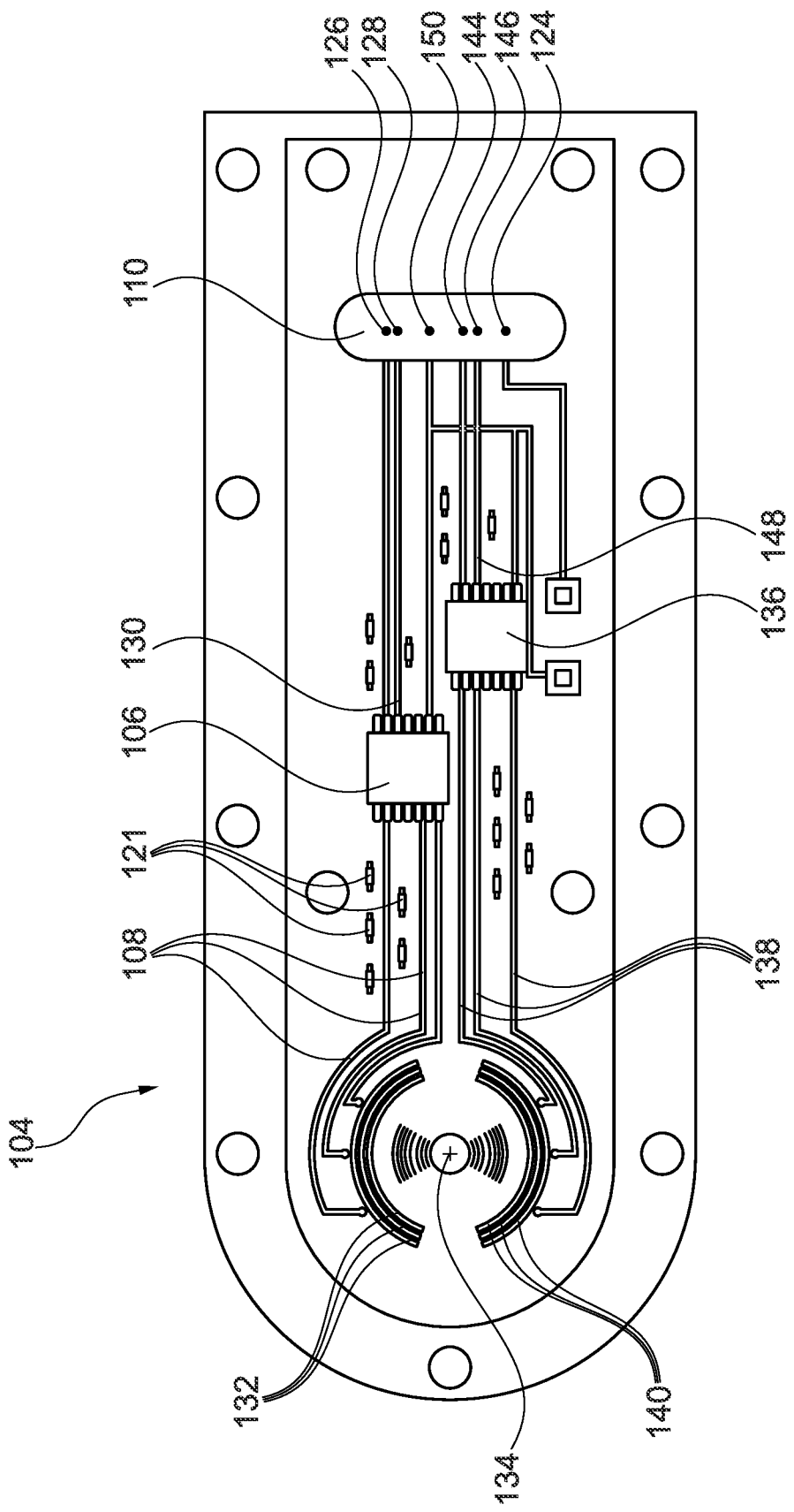
FIG. 4 illustrates a detail view of a circuit board for the electro-mechanical park lock actuator of FIG. 1.
Figure 5:
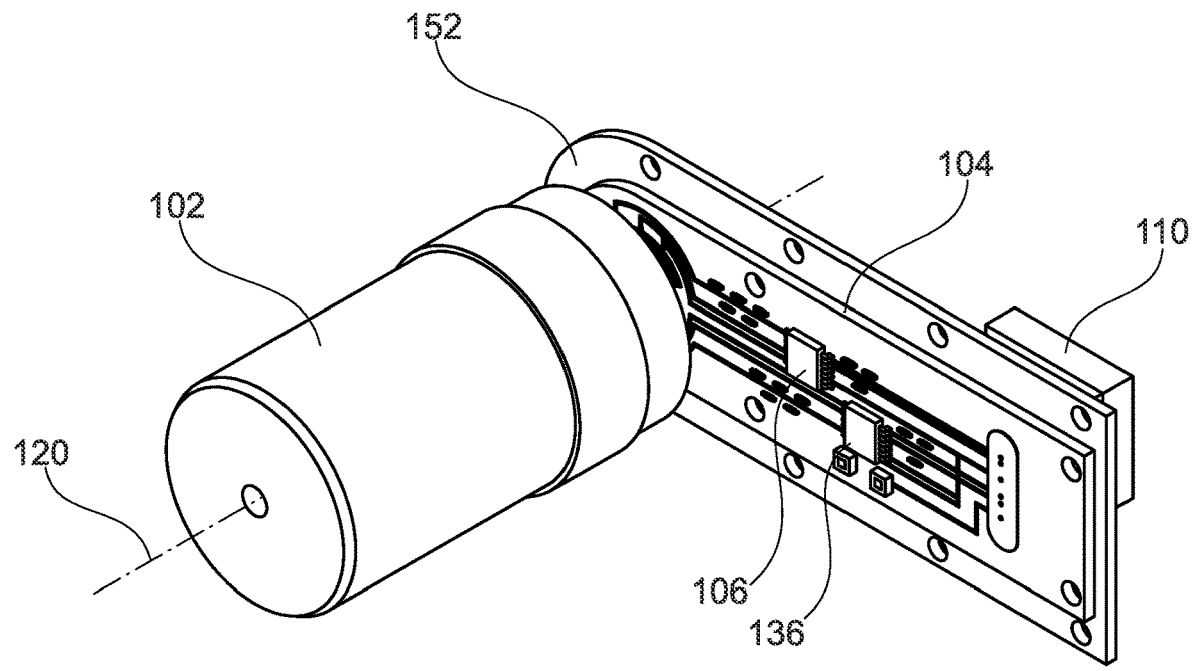
FIG. 5 illustrates a perspective view of a shaft and a circuit board for the electro-mechanical park lock actuator of FIG. 1.
Figure 6:
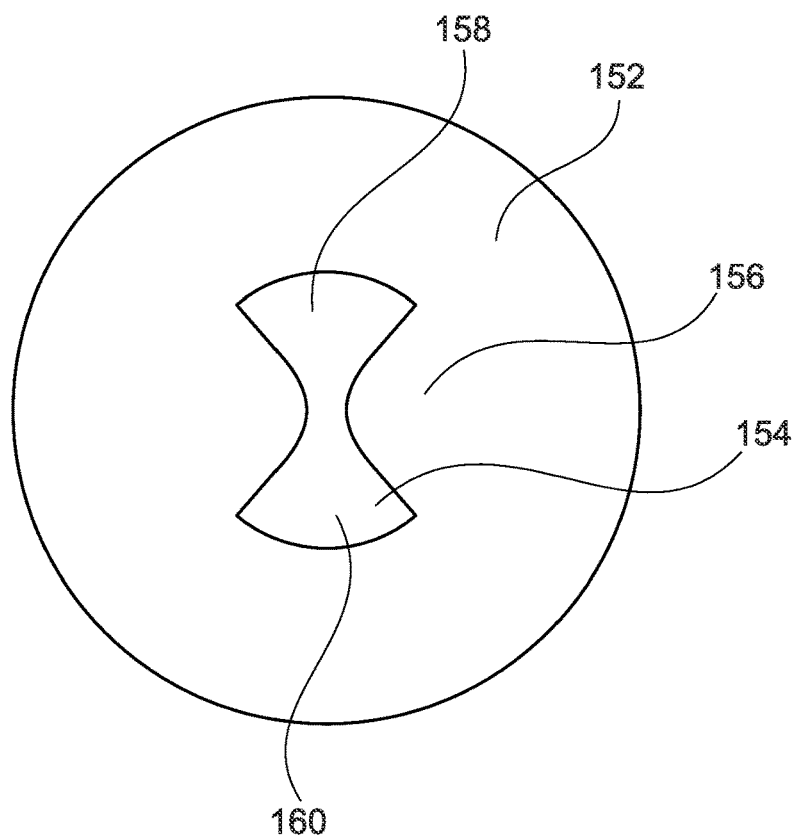
FIG. 6 illustrates an end view of the shaft of FIG. 5.

The following description is made with reference to FIGS. 1-6. FIG. 1 illustrates a front perspective view of electro-mechanical park lock actuator 100 with a portion of housing 101 removed. FIG. 2 illustrates a back perspective view of the electro-mechanical park lock actuator of FIG. 1 with the portion of the housing removed. FIG. 3 illustrates a perspective exploded view of the electro-mechanical park lock actuator of FIG. 1. FIG. 4 illustrates a detail view of circuit board 104 for the electro-mechanical park lock actuator of FIG. 1. FIG. 5 illustrates a perspective view of shaft 102 and circuit board 104 for the electro-mechanical park lock actuator of FIG. 1. FIG. 6 illustrates an end view of shaft 102 of FIG. 5.

Electro-mechanical park lock actuator 100 includes shaft 102, and circuit board 104. Shaft 102 is arranged for connecting to a transmission park pawl (not shown) in a vehicle transmission, for example. By park pawl, we mean a transmission component that locks a transmission output shaft to a transmission case, preventing the vehicle from moving. Traditionally, park pawls have been engaged by a shift lever attached to a column shifter or a floor shifter. Circuit board 104 includes non-contact inductive position sensor integrated circuit 106, trace 108 electrically connected to sensor 106 for determining an angular position of the shaft, and electrical connector 110 for connecting the circuit board to an external master controller (not shown). Actuator 100 is at least partially enclosed in housing 101 formed from halves 103 and 105, and fixed together by bolts or screws 107.

Electro-mechanical park lock actuator 100 includes electric motor 112 drivingly connected to the shaft, and transmission 114 arranged in a torque path between the electric motor and the shaft. Transmission 114 includes cycloid reduction 116 and spur gear reduction 118. In the example embodiment shown, the cycloid reduction is 40:1 and the spur gear reduction is 2:1. Shaft 102 includes axis 120 and electric motor 112 includes axis 122, parallel to and offset from the axis 122. Shaft 102 is at least partially supported by bushings, or bearings, 109 and 111, and spur gear reduction 118 is partially supported by bushing, or bearing, 113, installed in housing 101. Motor cover 115 is fixed to housing 101 by bolts, or screws, 117. Bolts 117 also affix portion 119 of the cycloid reduction to the housing.

Electrical connector 110 includes pin 124 arranged for connection to an electric motor power supply (not shown), pin 126 arranged for connection to a power supply (not shown) for non-contact inductive position sensor integrated circuit 106, and pin 128 arranged to connect output 130 of non-contact inductive position sensor integrated circuit 106 to the external master controller (not shown). Output 130 uses a Single Edge Nibble Transmission protocol, for example. More information on the SENT protocol can be found in the SAE J2716 standard available from the Society of Automotive Engineers.

Trace 108 includes at least one arc 132 with center 134. Shaft axis 120 is aligned with center 134. Non-contact inductive position sensor integrated circuit 106 is a 12 bit sensor capable of determining an angular position of the shaft with a resolution of 0.015 degrees. Integrated circuit 106 may be a ZMID5203 integrated circuit manufactured by Integrated Drive Technology, for example. Circuit board 104 includes a non-contact inductive position sensor integrated circuit 136 and trace 138 electrically connected to non-contact inductive position sensor integrated circuit 136 for determining the angular position of the shaft. Trace 138 includes arc 140 with center 142, aligned with center 134. Arc 132 and arc 140 are arranged around center 134 and 180 degrees apart. Circuit board 104 includes a plurality of traces 108 and a plurality of arcs 132 electrically connected to respective traces. Circuit board 104 includes a plurality of traces 138 and a plurality of arcs 140 electrically connected to respective traces. Circuit board 104 includes a plurality of capacitors and/or resistors 121 as required.

Electrical connector 110 includes pins 144 and 146. Pin 144 is arranged for connection to a power supply (not shown) for non-contact inductive position sensor integrated circuit 136. Pin 146 is arranged to connect output 148 of non-contact inductive position sensor integrated circuit 136 to the external master controller (not shown).

Electro-mechanical park lock actuator 100 is capable of an Automotive Safety Integrity Level (ASIL) D rating when paired with an appropriate master controller. That is, electromechanical park lock actuator 100 includes circuitry and built-in redundancy required for an ASIL D rating when the features of actuator 100 are properly exploited by software in the master controller. More information on ASIL ratings is available in the International Standards Organization (ISO) 26262 standard.

Electrical connector 110 has exactly six pins. Pin 150 is arranged for connection to a common ground (not shown). Shaft 102 includes end 152 with target 154. Integrated circuits 106 and 136 arranged to determine an angular position of shaft 102 as target 154 rotates relative to trace 108 and 138, respectively. Portion 156 of end 152 is machined so that target 154 protrudes from the portion 156. Target 154 includes sectors 158 and 160 arranged 180 degrees apart. By sector, we mean the part of a circle enclosed by two radii of the circle and their intercepted arc. In other words, a pie-shaped part of the circle.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the disclosure that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

LIST OF REFERENCE NUMERALS

100 Electro-mechanical park lock actuator
101 Housing
102 Shaft

103 Housing half
104 Circuit board
105 Housing half
106 Non-contact inductive position sensor integrated circuit
107 Bolts or screws
108 Trace
109 Bushing or bearing
110 Electrical connector
111 Bushing or bearing
112 Electric motor
113 Bushing or bearing
114 Transmission
115 Motor cover
116 Cycloid reduction
117 Bolts or screws
118 Spur gear reduction
119 Cycloid reduction portion
120 Axis
121 Capacitors and/or resistors
122 Motor axis
124 Pin for electric motor power supply
126 Pin for sensor power supply
128 Pin connected to sensor output
130 Sensor output
132 Arc
134 Arc center
136 Non-contact inductive position sensor integrated circuit
138 Trace
140 Arc
142 Arc center
144 Pin for sensor power supply
146 Pin connected to sensor output
148 Sensor output
150 Pin for common ground
152 Shaft end
154 Target
156 Machined portion
158 Sector
160 Sector

What is claimed is:

1. An electro-mechanical park lock actuator comprising:
a shaft arranged for connecting to a transmission park pawl;
a circuit board comprising:
a first non-contact inductive position sensor integrated circuit;
a first trace electrically connected to the first non-contact inductive position sensor integrated circuit for determining an angular position of the shaft; and,
an electrical connector for connecting the circuit board to an external master controller, wherein:
the first trace comprises at least one arc;
the at least one arc comprises a first center; and
the shaft comprises a first axis aligned with the first center.

2. The electro-mechanical park lock actuator of claim 1 further comprising an electric motor drivingly connected to the shaft.

3. The electro-mechanical park lock actuator of claim 2 further comprising a transmission arranged in a torque path between the electric motor and the shaft.

4. The electro-mechanical park lock actuator of claim 3 wherein the transmission comprises a cycloid reduction or a spur gear reduction.

5. The electro-mechanical park lock actuator of claim 4 wherein the cycloid reduction is 40:1 and the spur gear reduction is 2:1.

6. The electro-mechanical park lock actuator of claim 2 wherein
the electric motor comprises a second axis, parallel to and offset from the first axis.

7. An electro-mechanical park lock actuator comprising:
a shaft arranged for connecting to a transmission park pawl;
a circuit board comprising:
a first non-contact inductive position sensor integrated circuit,
a first trace electrically connected to the first non-contact inductive position sensor integrated circuit for determining an angular position of the shaft; and
an electrical connector for connecting the circuit board to an external master controller, the electrical connector comprising:
a first pin arranged for connection to an electric motor power supply;
a second pin arranged for connection to a first power supply for the first non-contact inductive position sensor integrated circuit; and,
a third pin arranged to connect a first output of the first non-contact inductive position sensor integrated circuit to the external master controller.

8. The electro-mechanical park lock actuator of claim 7 wherein the first output uses a Single Edge Nibble Transmission protocol.

9. The electro-mechanical park lock actuator of claim 1 wherein the first non-contact inductive position sensor integrated circuit is a 12 bit sensor capable of determining the angular position of the shaft with a resolution of 0.015 degrees.

10. The electro-mechanical park lock actuator of claim 1 wherein the circuit board comprises:
a second non-contact inductive position sensor integrated circuit; and,
a second trace electrically connected to the second non-contact inductive position sensor integrated circuit for determining the angular position of the shaft.

11. The electro-mechanical park lock actuator of claim 10 wherein:
the first trace comprises a first arc with the first center; and,
the second trace comprises a second arc with a second center, aligned with the first center.

12. The electro-mechanical park lock actuator of claim 11 wherein the first arc and the second arc are arranged around the first center and 180 degrees apart.

13. The electro-mechanical park lock actuator of claim 10 wherein the circuit board comprises:
a plurality of first traces and a plurality of first arcs; and,
a plurality of second traces and a plurality of second arcs.

14. The electro-mechanical park lock actuator of claim 10 wherein the electrical connector comprises:
a first pin arranged for connection to an electric motor power supply;
a second pin arranged for connection to a power supply for the first non-contact inductive position sensor integrated circuit;
a third pin arranged to connect a first output of the first non-contact inductive position sensor integrated circuit to the external master controller;

a fourth pin arranged for connection to a power supply for the second non-contact inductive position sensor integrated circuit; and, a fifth pin arranged to connect a second output of the second non-contact inductive position sensor integrated circuit to the external master controller.

15. The electro-mechanical park lock actuator of claim 10 wherein the electro-mechanical park lock actuator is capable of an Automotive Safety Integrity Level D rating when the master controller is properly programmed.

16. The electro-mechanical park lock actuator of claim 1 wherein the electrical connector includes exactly six pins.

17. The electro-mechanical park lock actuator of claim 1 wherein the shaft includes an end with a target.

18. An electro-mechanical park lock actuator comprising:
   a shaft arranged for connecting to a transmission park pawl;
   a circuit board comprising:
      a first non-contact inductive position sensor having:
         a first non-contact inductive position sensor integrated circuit;
         a first trace electrically connected to the first non-contact inductive position sensor integrated circuit for determining an angular position of the shaft; and,
      a second non-contact inductive position sensor having:
         a second non-contact inductive position sensor integrated circuit;
         a second trace electrically connected to the second non-contact inductive position sensor integrated circuit for determining the angular position of the shaft; and,
   an electrical connector configured to connect the circuit board to an external master controller, wherein:
   the first trace comprises a first arc having a first center; and
   the second trace comprises a second arc having a second center.

* * * * *